United States Patent [19]

Usui

[11] Patent Number: 5,055,921
[45] Date of Patent: Oct. 8, 1991

[54] COLOR READING LINE SENSOR

[75] Inventor: Yoshiko Usui, Tokyo, Japan

[73] Assignee: Canon Kabushiki Kaisha, Tokyo, Japan

[21] Appl. No.: 223,399

[22] Filed: Jul. 25, 1988

[30] Foreign Application Priority Data

Jul. 29, 1987 [JP] Japan .............................. 62-191144

[51] Int. Cl.⁵ ......................................... H04N 09/04
[52] U.S. Cl. ....................................... 358/44; 358/41; 358/43; 358/75
[58] Field of Search ....................... 358/75, 77, 78, 80, 358/44, 43, 41; 250/578, 226

[56] References Cited

U.S. PATENT DOCUMENTS

| | | | |
|---|---|---|---|
| 4,151,553 | 4/1979 | Sugihara | 358/44 |
| 4,481,530 | 11/1984 | Wagersonner et al. | 358/44 |
| 4,641,183 | 2/1987 | Kinoshita | 358/44 |
| 4,692,794 | 9/1987 | Suzuki | 358/44 |
| 4,745,467 | 5/1988 | Sekizawa et al. | 358/75 |
| 4,870,483 | 9/1989 | Nishigaki et al. | 358/44 |

FOREIGN PATENT DOCUMENTS

| | | | |
|---|---|---|---|
| 56-89176 | 7/1981 | Japan | 358/44 |
| 58-3485 | 1/1983 | Japan | 358/44 |
| 59-67791 | 4/1984 | Japan | 358/44 |
| 61-26363 | 2/1986 | Japan . | |

*Primary Examiner*—James J. Groody
*Assistant Examiner*—Kim Yen Vu
*Attorney, Agent, or Firm*—Fitzpatrick, Cella, Harper & Scinto

[57] ABSTRACT

In a color reading line sensor, there are provided a plurality of sensor arrays each comprising a plurality of sensor elements with color filter elements. These sensor arrays are aligned in a direction normal to a sensor array direction, and the size of a particular color sensor element in a direction normal to the sensor array direction is set to be larger than that of the other color sensor element in the same direction.

25 Claims, 9 Drawing Sheets

BLUE SENSOR'S WIDTH (LINE SENSOR MOVE DIRECTION)
---
RED(GREEN) SENSOR'S WIDTH (LINE SENSOR MOVE DIRECTION)

COLOR READING LINE SENSOR

BACKGROUND OF THE INVENTION

The present invention relates to a color reading line sensor having a color filter of a plurality of colors for color-separating a color image.

A conventional color reading sensor comprises a photoelectric transducer element such as a CCD (Charge-Coupled Device). A color filter of a plurality of colors is mounted on the front surface of the photoelectric transducer element to separate the color components. A so-called color reading line sensor having a color reading sensor array is used in a color copying machine or a color facsimile reading unit.

A standard illumination source 2 (FIG. 4) such as a halogen lamp is used as an original illumination light source, and a three-line CCD (FIG. 5) is used as a color original reading line sensor. An R (red) filter element is formed on the first line of the three-line CCD, a G (green) filter element is formed on the second line, and a B (blue) filter element is formed on the third line. A direction A—A' indicates a relative movement direction of the CCD and the original.

Figure 3:
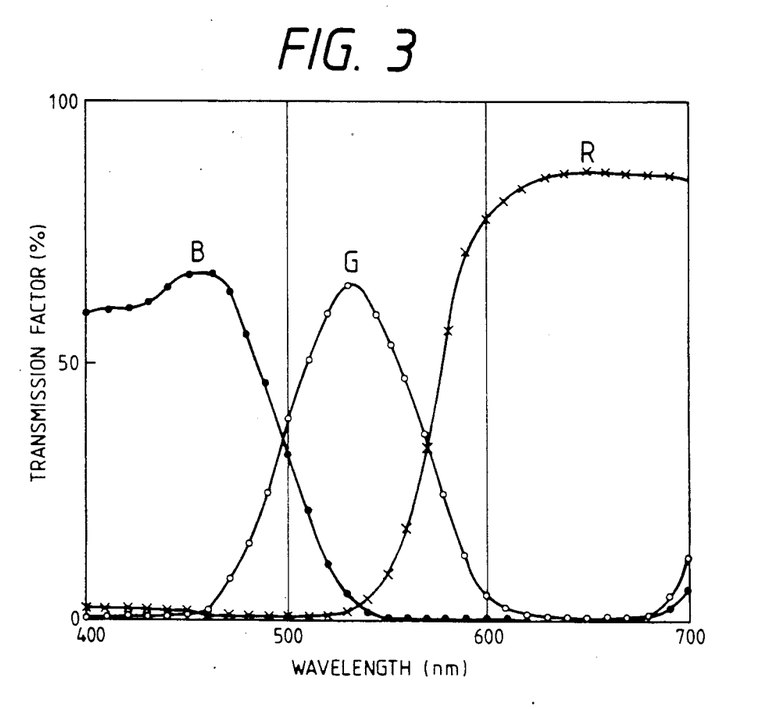
FIG. 3 is a graph showing spectral characteristics of an RGB filter.

Since a spectral distribution of the filter elements is given as shown in FIG. 3, an output from the blue filter element is smaller than those of red and green filter elements A S/N ratio and linearity of the blue filter element are undesirably degraded. In order to solve this problem, two pels (pixels) are assigned to the blue component, and one pel is assigned to each of the red and green components, as described in Japanese Utility Model Laid-Open (Kokai) No. 61-26363. Another example includes two sensor arrays to increase the size of the blue pel area as compared with those of the red and green areas, as described in Japanese Patent Laid-Open (Kokai) No. 62-81163. Still another example is to improve sensitivity by assigning a plurality of pels to all the red, green, and blue components, as described in U.S. Pat. No. 4,264,921.

However, in Japanese Utility Model Laid-Open (Kokai) No. 61-26363, four pels must be used to express one dot, so that the size of each pel is smaller than the conventional pel. Even if two blue pels are given, the sensitivity of other pels (i.e., red and green pels) is degraded as compared with the conventional case. In Japanese Patent Laid-Open No. 62-81163, an output from the blue pels can be increased, but color misregistration undesirably occurs in an output image due to a phase difference between the red and green pels. In U.S. Pat. No. 4,264,921, data of a plurality of pels are used to obtain red, green, and blue outputs, and the number of pels is increased in inverse proportion to the number of pels. Therefore, the overall structure is increased, and transfer time is prolonged. An amplifier may be arranged to increase a blue output. However, noise is also increased. As a result, the result is poorer than the output prior to amplification.

SUMMARY OF THE INVENTION

It is an object of the present invention to provide a color reading line sensor which can eliminate the conventional problems described above and have a higher resolution.

It is another object of the present invention to provide a color reading line sensor including a color sensor portion provided with a filter of a plurality of colors, wherein the size of the sensor whose sensitivity is degraded by a light source is increased in a relative movement direction between the light source and the line sensor so that the size thereof can be set to be larger than other sensors.

DETAILED DESCRIPTION OF THE PREFERRED EMBODIMENTS:

Preferred embodiments of the present invention will be described in detail with reference to the accompanying drawings.

Figure 4:
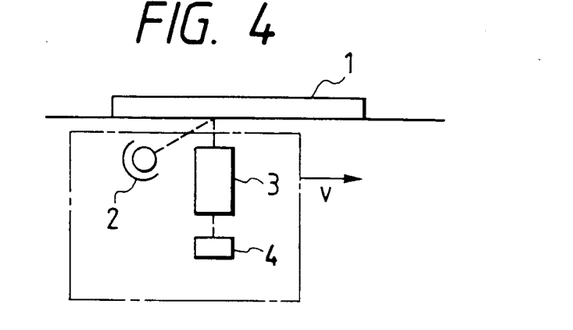
FIG. 4 is a view showing a copying apparatus incorporating a color reading line sensor according to an embodiment of the present invention.

FIG. 4 is a schematic view of a copying apparatus incorporating a color reading line sensor according to the present invention. The copying apparatus includes an illumination system 2, an imaging optical system 3, and a sensor 4 of the present invention. An original 1 is placed on the upper surface of the copying machine.

Upon depression of a copy button (not shown), the illumination system 2, the imaging optical system 3, and the sensor 4 are moved in a direction indicated by an arrow v.

A standard illumination source A such as a halogen lamp is used as the illumination system 2.

Figure 5:
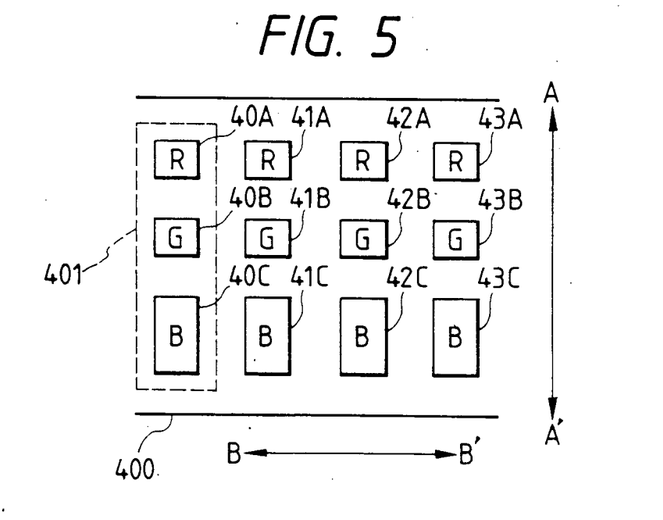
FIG. 5 is a view showing the color reading line sensor according to the present invention.

FIG. 5 is a schematic view showing a color reading line sensor according to an embodiment of the present invention. Referring to FIG. 5, red (R), green (G), and blue (B) filter elements are formed and grouped on a chip 400. A set of one red filter element, one green filter element, and one blue filter element constitutes a photocell 401. This line filter includes red filter elements 40A, 41A, 42A and 43A, green filter elements 40B, 41B, 42B, and 43B, and blue filter elements 40C, 41C, 42C, and 43C. These filter elements constitute part of the line sensor. In other words, an array of sensor elements with the red filter elements 40A, 41A, 42A, and 43A (to be also referred to as sensor elements 40A, 41A, 42A, and 43A hereinafter), an array of sensor elements with the green filter elements 40B, 41B, 42B, and 43B (to be also referred to as sensor elements 40B, 41B, 42B, and 43B hereinafter), and an array of sensor elements with the blue filter elements 40C, 41C, 42C, and 43C (to be also referred to as sensor elements 40C, 41C, 42C, and 43C hereinafter) are arranged in a direction (i.e., the A—A' direction) substantially perpendicular to the sensor array direction (i.e., the B—B' direction).

The A—A' direction is a movement direction (the CCD movement direction) of the color reading line sensor, and the B—B' direction is an array direction (i.e., the direction substantially perpendicular to the CCD movement direction). As shown in FIG. 5, the width of the line sensor portion consisting of the sensor elements 40C, 41C, 42C, and 43C along the movement direction (the A—A' direction) is larger than the width of the line sensor portion consisting of the sensor elements 40A, 41A, 42A, and 43A or the sensor elements 40B, 41B, 42B, and 43B along the movement direction (i.e., the A—A' direction). As described above, the blue sensor width along the line sensor movement direction is set to be larger than the red or green sensor width therealong. Sensitivity of the blue sensor elements can be increased, and the blue sensor elements can have the same resolution as that of the red or green sensor elements, thereby providing high image quality.

In other words, in the color reading line sensor including a sensor array of a plurality of sensor elements as the red filter elements, an array of a plurality of sensor elements as the green filter elements, and an array of a plurality of sensor elements as the blue filter elements, and arranged such that the arrays are substantially perpendicular to the sensor array direction, the width of the sensor portion with the blue sensor element array in a direction substantially perpendicular to the sensor array direction is set to be larger than the width of the sensor portion with the red or green sensor element array in the direction substantially perpendicular to the sensor array direction. The sensitivity of the blue sensor portion can be improved and the blue sensor can have the same resolution as that of the red or green sensor portion, thereby providing high image quality.

In the above embodiment, the original 1 is fixed, and the optical unit including the sensor is moved to scan the original 1. However, the optical unit including the sensor 4 may be fixed, and the original 1 may be moved to perform scanning of the original 1.

The above object of the present invention can be achieved such that the width of the sensor array of the blue filter elements along the relative movement direction between the light source and the line sensor is set to be larger than the width of the sensor array of the red or green filter elements along the relative movement direction between the light source and the line sensor.

Figure 6:
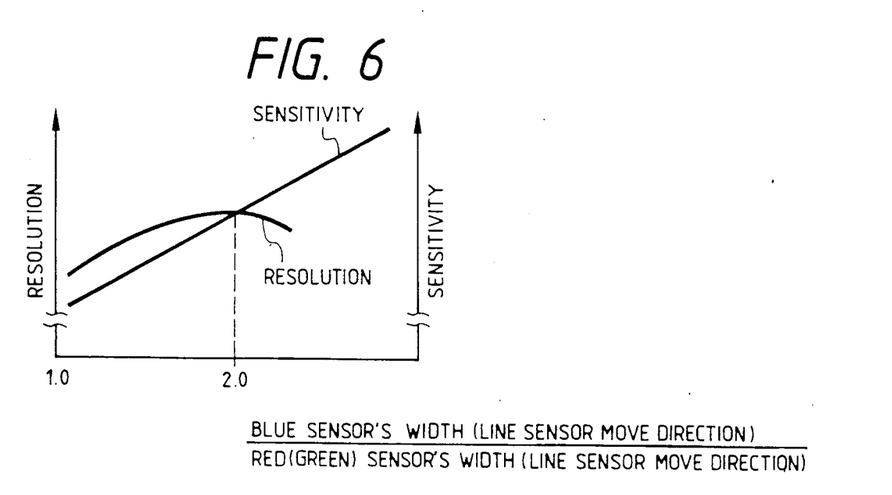
FIG. 6 is a graph showing the relationship between the sensor width, the sensitivity, and the resolution.

According to an experiment conducted by the present inventor, preferable results could be obtained when the blue sensor width along the line sensor movement direction was set to be larger than the red or green sensor width within the range of 1.8 times to 2.2 times. As shown in FIG. 6, the best result could be obtained when the blue sensor width along the line sensor movement direction was set to be twice the red or green sensor width. When the width exceeded twice, the sensitivity of the line sensor could be increased, but its resolution was degraded.

Figure 7A:
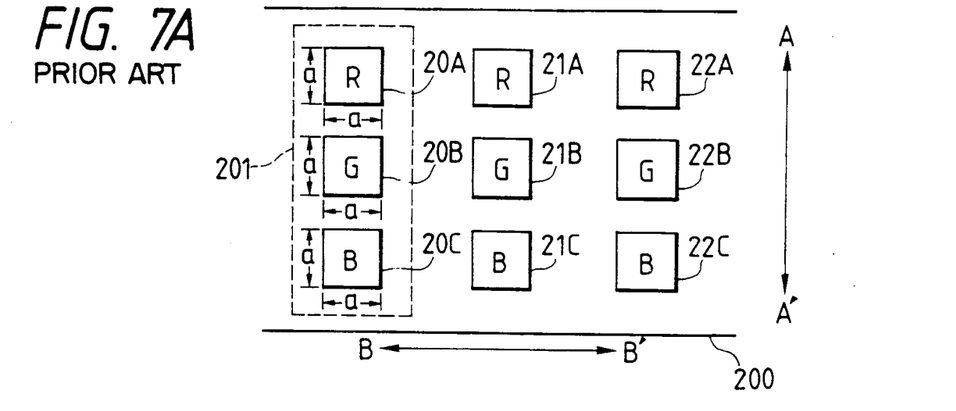
FIGS. 7A, 7B, and 7C are views for comparing the conventional color reading line sensor and the color reading line sensor of the present invention.
Figure 7B:
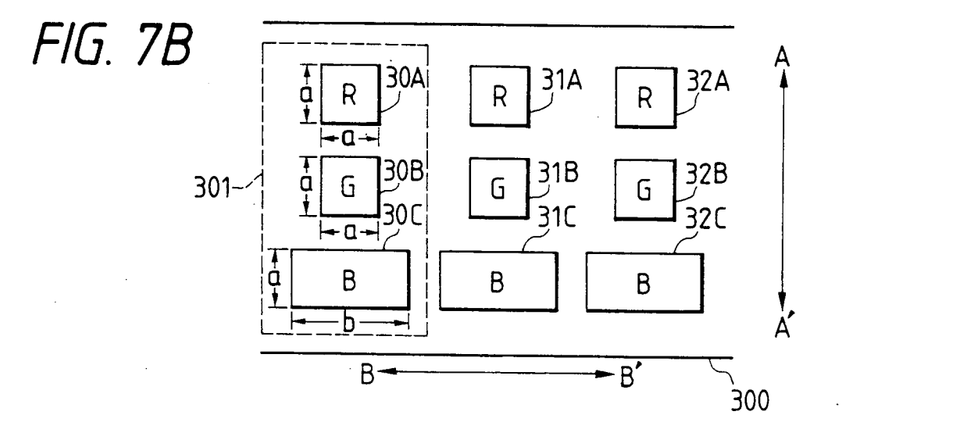
Figure 7C:
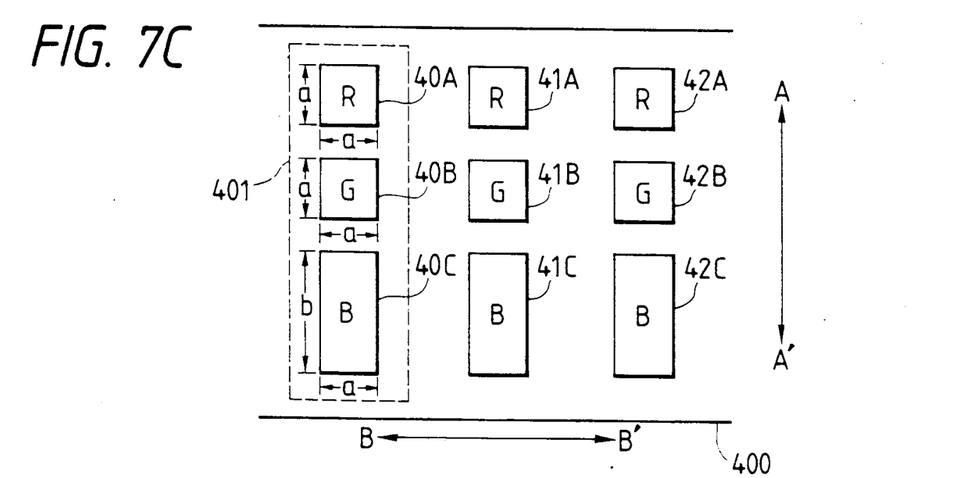
Figure 8A:
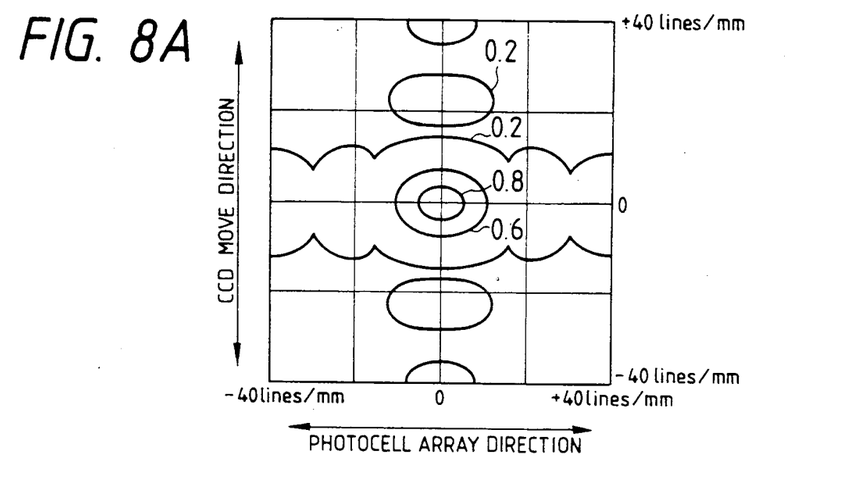
FIGS. 8A, 8B, and 8C are views showing MTFs when scanning is performed with a color reading line sensor.
Figure 8B:
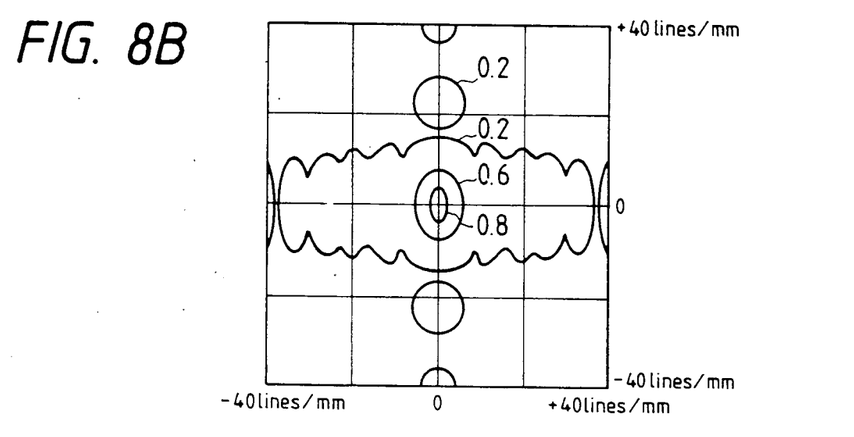
Figure 8C:
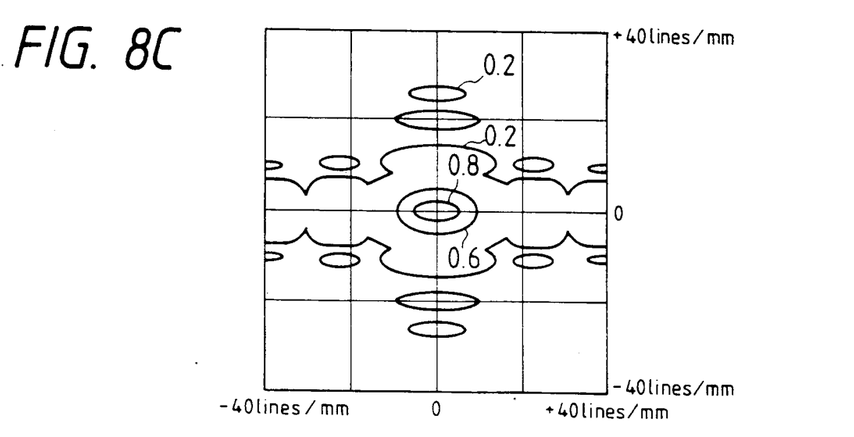
Figure 9:
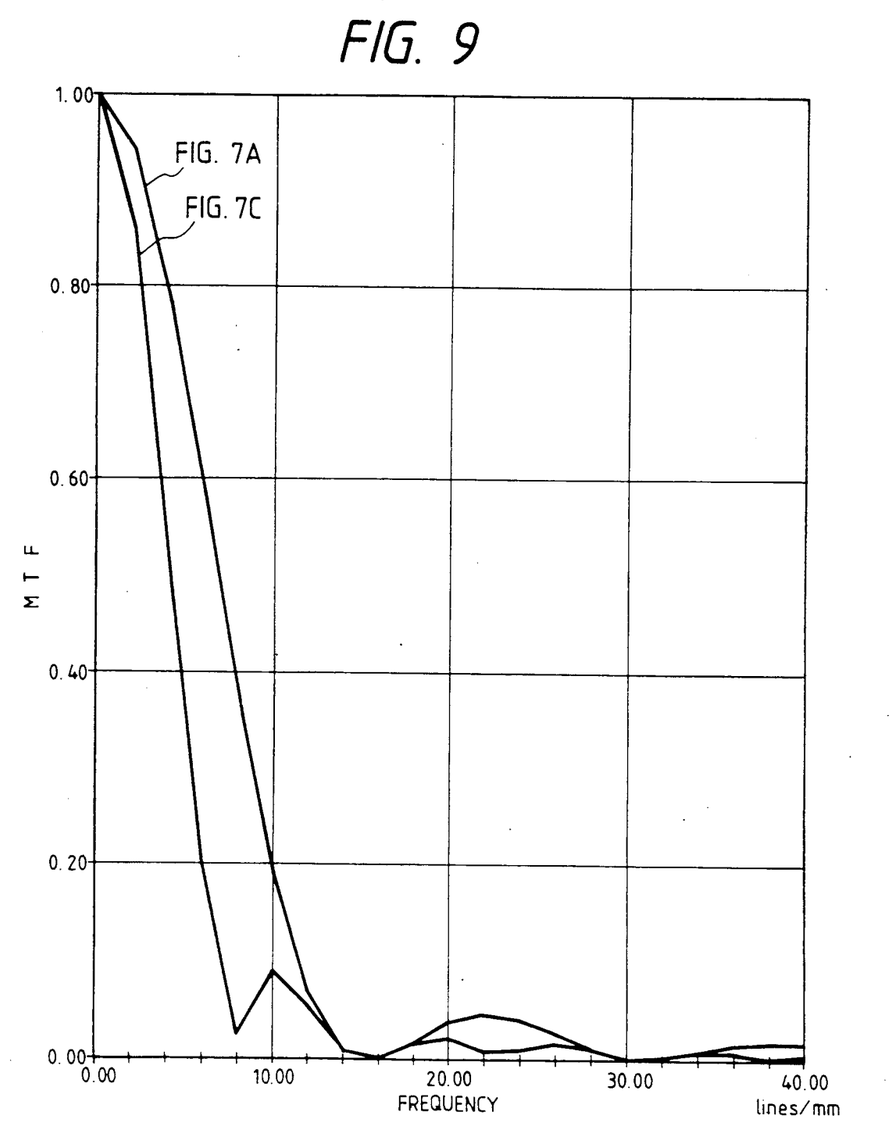
FIG. 9 is a graph showing an MTF in the sensor movement direction when scanning is performed with a color reading line sensor.

FIGS. 7A, 7B, and 7C are views for comparing the conventional color reading line sensor and the color reading line sensor of the present invention. More specifically, FIG. 7A shows a sensor portion (the blue sensor element has the same size as that of the red or green sensor element) of a conventional 3-line sensor. Referring to FIG. 7A, red (R), green (G), and blue (B) filter elements are formed and grouped on a chip 200. A set of one red filter element, one blue filter element, and one green filter element constitutes a photocell 201. The line sensor includes red filter elements 20A, 21A, and 22A, green filter elements 20B, 21B, and 22B, and blue filter elements 20C, 21C, and 22C. These color filter elements constitute part of the line sensor. In other words, an array of sensor elements with the red filter elements 20A, 21A, and 22A (to be also referred to as sensor elements 20A, 21A, and 22A hereinafter), an array of sensor elements with the green filter elements 20B, 21B, and 22B, (to be also referred to as sensor elements 20B, 21B, and 22B hereinafter), and an array of sensor elements with the blue filter elements 20C, 21C, and 22C (to be also referred to as sensor elements 20C, 21C, and 22C hereinafter) are arranged in a direction (i.e., the A—A' direction) substantially perpendicular to the sensor array direction (i.e., the B—B' direction). The A—A' direction is a move direction (the CCD move direction) of the color reading line sensor, and the B—B' direction is a photocell array direction (i.e., the direction substantially perpendicular to the CCD move direction). As is apparent from FIG. 7A, the widths of all sensor elements are identical to a in both the A—A' and B—B' directions. FIG. 7B shows a sensor arrangement wherein the width of each blue sensor element is increased twice in the B—B' direction (i.e., the photocell array direction) (b = 2a). Referring to FIG. 7B, red (R), green (G), and blue (B) filter elements are formed and grouped on a chip 300. A set of one red filter element, one blue filter element, and one green filter element constitutes a photocell 301. The line sensor includes red filter elements 30A, 31A, and 32A, green filter elements 30B, 31B, and 32B, and blue filter elements 30C, 31C, and 32C. These color filter elements constitute part of the line sensor. In other words, an array of sensor elements with the red filter elements 30A, 31A, and 32A (to be also referred to as sensor elements 30A, 31A, and 32A hereinafter), an array of sensor elements with the green filter elements 30B, 31B, and 32B, (to be also referred to as sensor elements 30B, 31B, and 32B hereinafter), and an array of sensor elements with the blue filter elements 30C, 31C, and 32C (to be also referred to as sensor elements 30C, 31C, and 32C hereinafter) are arranged in a direction (i.e., the A—A' direction) substantially perpendicular to the sensor array direction (i.e., the B—B' direction). The A—A' direction is a movement direction (the CCD movement direction) of the color reading line sensor, and the B—B' direction is a photocell array direction (i.e., the direction substantially perpendicular to the CCD movement direction). As shown in FIG. 7B, the widths of all red and green sensor elements are identical to a in both the A—A' and B—B' directions. The width of each blue sensor element along the A—A' direction is a, and its width along the B—B' direction is b (b = 2a). FIG. 7C shows a sensor portion of the 3-line sensor according to the present invention. Referring to FIG. 7C, red (R), green (G), and blue (B) filter elements are formed and grouped on a chip 400. A set of one red filter element, one green filter element, and one blue filter element constitutes a photocell 401. The line sensor includes red filter elements 40A, 41A, and 42A, green filter elements 40B, 41B, and 42B, and blue filter elements 40C, 41C, and 42C. These color filter elements constitute part of the line sensor. In other words, an array of sensor elements with the red filter elements 40A, 41A, and 42A (to be also referred to as sensor elements 40A, 41A, and 42A hereinafter), an array of sensor elements with the green filter elements 40B, 41B, and 42B, (to be also referred to as sensor elements 40B, 41B, and 42B hereinafter), and an array of sensor elements with the blue filter elements 20C, 21C, and 22C (to be also referred to as sensor elements 20C, 21C, and 22C hereinafter) are arranged in a direction (i.e., the A—A' direction) substantially perpendicular to the sensor array direction (i.e., the B—B' direction). The A—A' direction is a movement direction (the CCD move direction) of the color reading line sensor, and the B—B' direction is a photocell array direction (i.e., the direction substantially perpendicular to the CCD movement direction). As shown in FIG. 7C, the widths of all red and green sensor elements are identical to a in both the A—A' and B—B' directions. However, the width of each blue sensor element is b (b=2a) along the A—A' direction and a along the B—B' direction. FIGS. 8A to 8C show MTFs (Modulation Transfer Functions) of color reading line sensors (FIGS. 7A, 7B, and 7C) when scanning of 62.5 μm (=16 pels/mm) is performed, applied to the copying apparatus as shown in FIG. 4. FIGS. 8A to 8C show the MTFs in the form of contours in the spatial frequency range of +40 lines/mm. FIGS. 8A, 8B, and 8C correspond to FIGS. 7A, 7B, and 7C, respectively. FIG. 9 shows a resolution in the movement direction upon movement of the color reading line sensor. As shown in FIG. 9, a large MTF difference (about 40% at 6 lines/mm) occurs at 10 lines/mm or less in the conventional line sensor (FIG. 7A). However, an MTF difference is reduced to about 20% at 6 lines/mm in the line sensor of the present invention (FIG. 7C). However, in the line sensor wherein the blue sensor width is increased in the photocell array direction as shown in FIG. 7B, the resolution in the sensor move direction can be higher than that in FIG. 8A, as is apparent from FIG. 8B. However, the resolution in the photocell array direction is degraded at ±10 lines/mm In other words, the resolution in the sensor movement direction is limited by sensor movement.

Figure 10:
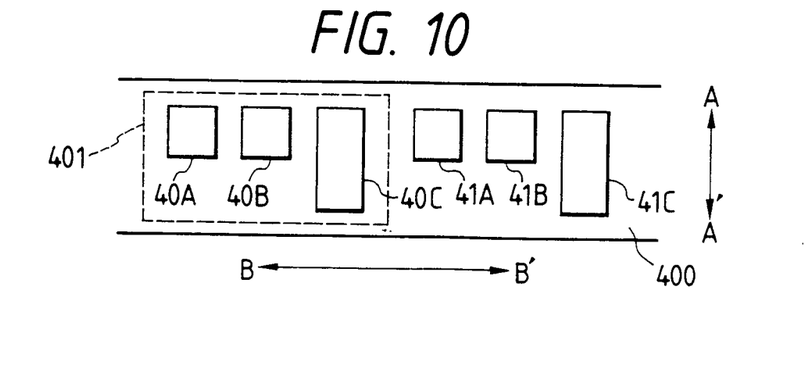
FIG. 10 is a view showing a color reading line sensor according to another embodiment of the present invention.
Figure 11:
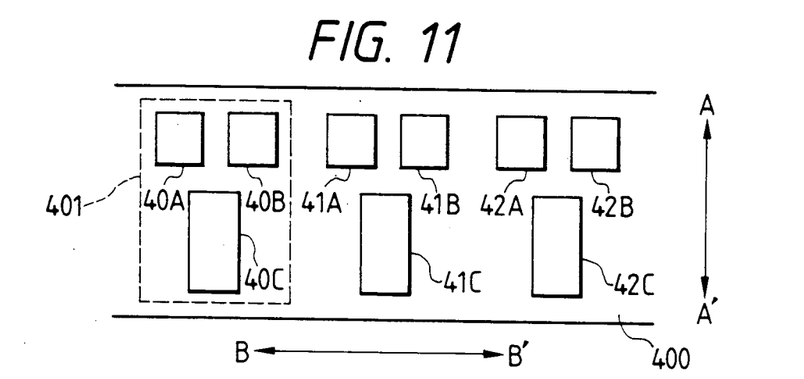
FIG. 11 is a view showing a color reading line sensor according to still another embodiment of the present invention.

The present invention is not limited to the above embodiment. For example, as shown in FIG. 10, red, green and blue sensor elements can be aligned in an array direction of a photocell 401 (i.e., the B—B' direction). In addition, as shown in FIG. 11, red and green sensor elements and a blue sensor element can be aligned in two arrays in the array direction of a photocell 401 (i.e., the B—B' direction). The A—A' direction is the line sensor movement direction (i.e., the CCD movement direction).

In the embodiment of FIG. 10, sensor elements 40A and 41A consisting of red filter elements, sensor elements 40B and 41B consisting of green filter elements, and sensor elements 40C and 41C consisting of blue filter elements are formed on a chip 400 such that the red, green, and blue filter elements are cyclically and continuously formed. The width of each of the sensor elements 40C and 41C of blue filter elements in the line sensor movement direction (i.e., the direction substantially perpendicular to the sensor array direction) is larger than the width of each of the sensor elements 40A and 41B of the red filter elements and the sensor elements 40B and 41B of the green filter elements. When the width of the sensor element of the blue filter along the line sensor movement direction was larger than the width of the sensor element of the red or green filter element within the range of 1.8 times to 2.2 times, good results could be obtained. The best result could be obtained when the width of the former was twice the latter.

In the embodiment of FIG. 11, a first sensor array of sensor elements 40A, 41A, and 42A consisting of red filter elements, and sensor elements 40B, 41B, and 42B consisting of green filter elements formed on a chip 400 are substantially perpendicular to a second sensor array consisting of sensor elements 40C, 41C, and 42C consisting of blue filter elements. The width of each of the sensor elements 40C and 41C of the blue filter elements in the line sensor movement direction (i.e., the direction substantially perpendicular to the sensor array direction) is larger than the width of each of the sensor elements 40A, 41A, and 42A of red filter elements and the sensor elements 40B, 41B, and 42B of the green filter elements along the line sensor movement direction (i.e., the direction substantially perpendicular to the sensor array direction). When the width of the sensor element of the blue filter along the line sensor movement direction was larger than the width of the sensor element of the red or green filter element within the range of 1.8 times to 2.2 times, good results could be obtained The best result could be obtained when the width of the former was twice the latter.

Figure 1:
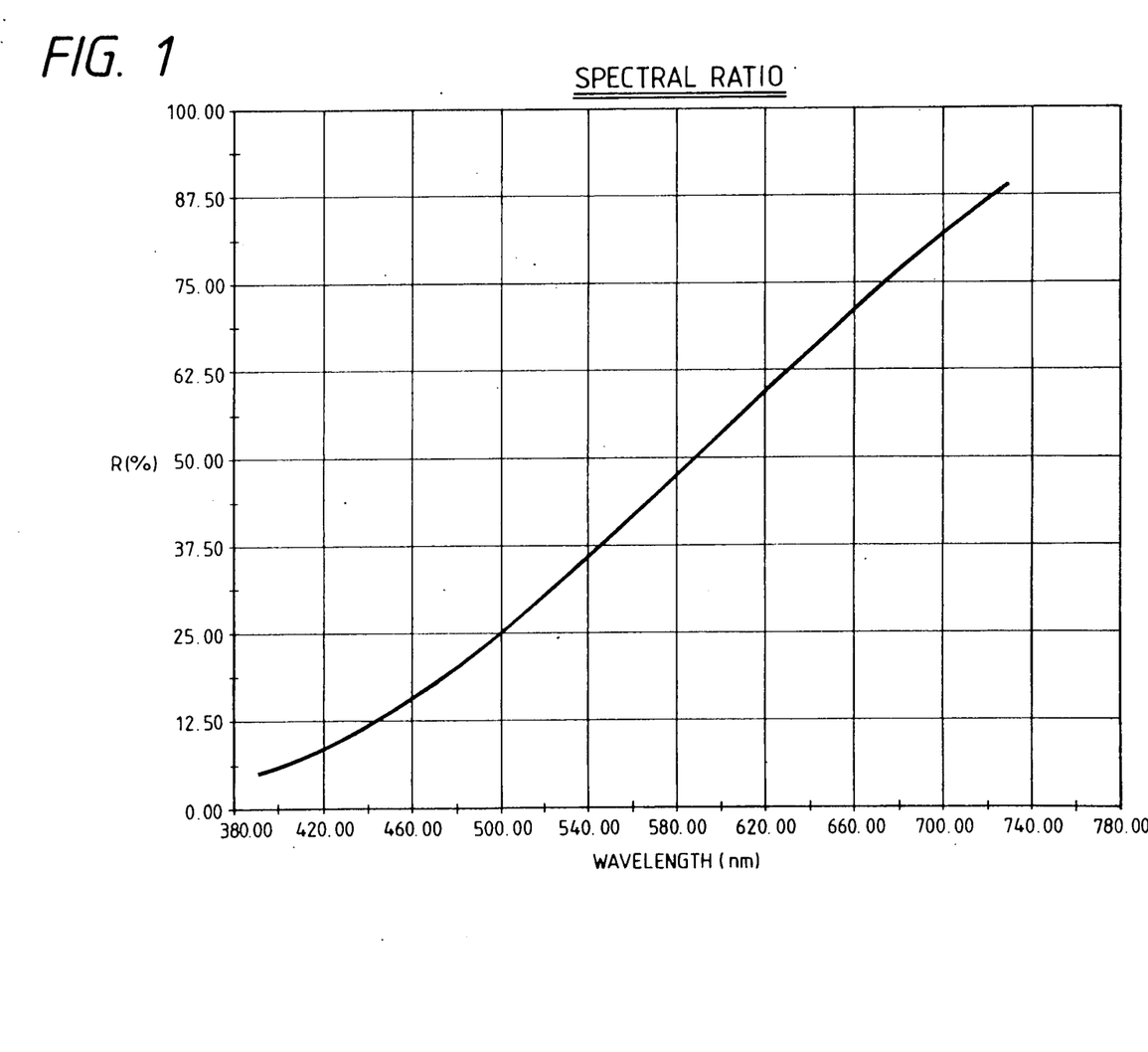
FIG. 1 is a graph showing the spectral reflectivity of a standard illumination source A.
Figure 2:
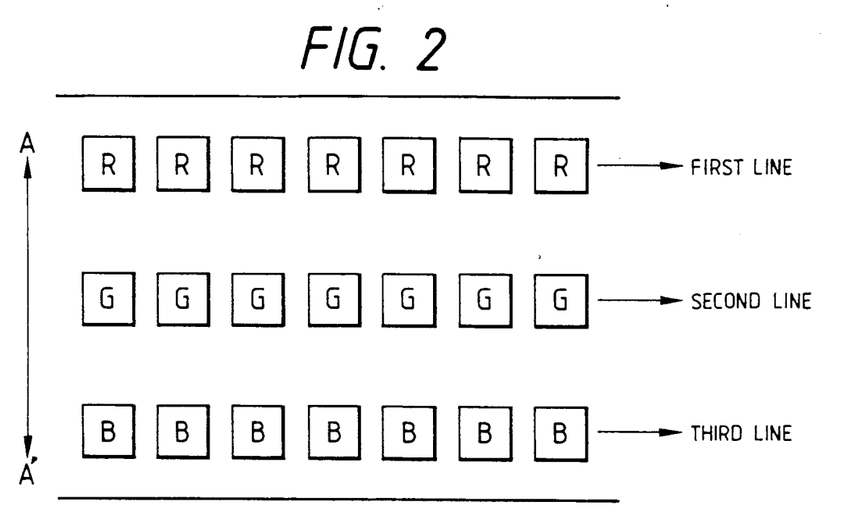
FIG. 2 is a view showing a conventional color reading line sensor.

In each of the above embodiments, the color reading line sensor having a tricolor (blue, green, and red) filter is exemplified. However, the colors of the filter are not limited to these colors. For example, a cyan filter element may be used in place of the blue filter element. In this case, the same results as in use of the blue filter element can be obtained. When the standard illumination source 2 shown in FIG. 1 is used as a light source and a tricolor filter of cyan, green, and red is used as a color reading line sensor, the width of the sensor element with the cyan filter element along the relative movement direction between the light source and line sensor must be set to be larger than the width of the sensor element with the red or green filter element along the relative movement direction therebetween, thereby achieving the object of the present invention. Alternatively, a tricolor filter of yellow (Y), green (G), and cyan (C) having the spectral characteristics shown in FIG. 12 may be used. In this case, when the standard illumination source 2 shown in FIG. 1 is used as a light source, an output from the sensor element with a cyan filter element is smaller than that from the sensor element with the green or yellow filter element. That is, when the standard illumination source shown in FIG. 1 is used as a light source and a color reading line sensor having a tricolor filter of cyan, green, and yellow is used, the width of the sensor element of the cyan filter element along the relative movement direction between the light source and the line sensor must be set to be larger than the width of the sensor element of the green or yellow filter element along the same relative direction, thereby achieving the object of the present invention.

Figure 12:
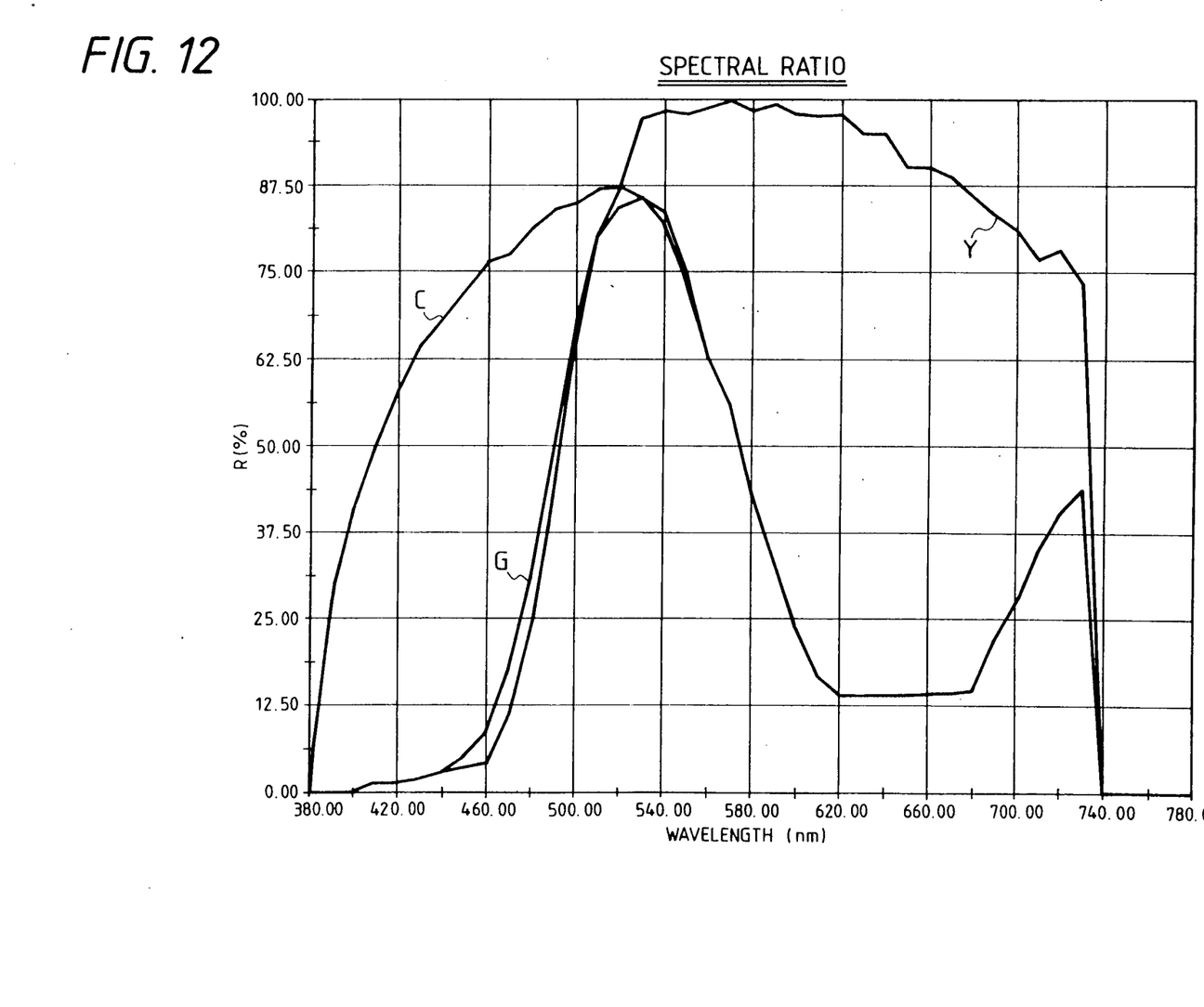
FIG. 12 is a graph showing spectral characteristics of a YGC filter.
Figure 13:
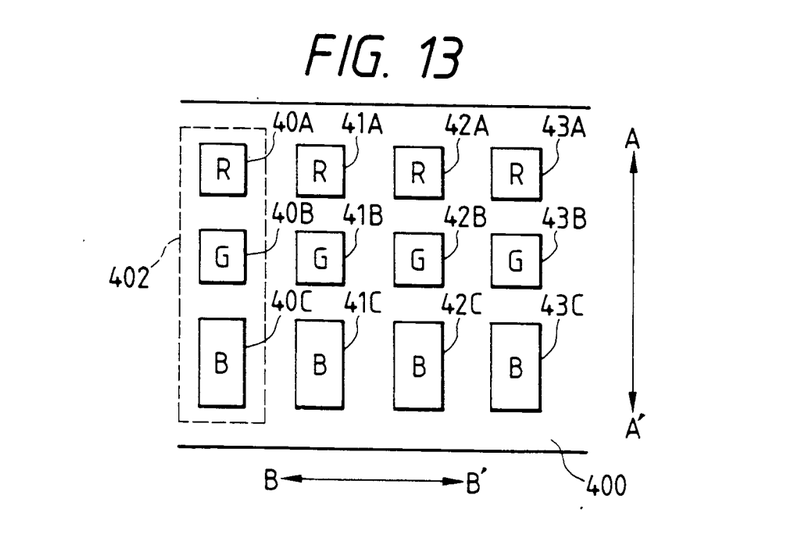
FIG. 13 is a view showing a color reading line sensor according to still another embodiment of the present invention.

In each of the above embodiments, the width of one of the color elements of the sensor is increased. However, it is possible to increase the widths of at least two of the color elements of the sensor. This embodiment will be described with reference to FIG. 13 wherein a color reading line sensor having a tricolor filter of blue, green, and red, as shown in FIG. 12, is used. Referring to FIG. 13, red (R), green (G), and blue (B) filter elements are formed and grouped on a chip 400. A set of one red filter element, one green filter element, and one blue filter element constitutes a photocell 401. This line filter includes red filter elements 40A, 41A, 42A and 43A, green filter elements 40B, 41B, 42B, and 43B, and blue filter elements 40C, 41C, 42C, and 43C. These filter elements constitute part of the line sensor. In other words, an array of sensor elements with the red filter elements 40A, 41A, 42A, and 43A (to be also referred to as sensor elements 40A, 41A, 42A, and 43A hereinafter), an array of sensor elements with the green filter elements 40B, 41B, 42B, and 43B (to be also referred to as sensor elements 40B, 41B, 42B, and 43B hereinafter), and an array of sensor elements with the blue filter elements 40C, 41C, 42C, and 43C (to be also referred to as sensor elements 40C, 41C, 42C, and 43C hereinafter) are arranged in a direction (i.e., the A—A' direction) substantially perpendicular to the sensor array direction (i.e., the B—B' direction). The A—A' direction is a movement direction (the CCD movement direction) of the color reading line sensor, and the B—B' direction is a photocell array direction (i.e., the direction substantially perpendicular to the CCD movement direction).

When the standard illumination source 2 (FIG. 1) such as a halogen lamp is used as an original illumination light source, the spectral distributions of red, green, and blue components of the filter are given as shown in FIG. 3. An output from the blue element is smaller than that of the red or green element, as described in the BACKGROUND above. An output from the green element is smaller than that from the red element. For these reasons, the width of the sensor element of the green filter element along the line sensor movement direction (i.e., the A—A' direction) is set to be slightly larger than the width of the sensor element of the sensor element of the red filter element along the line sensor movement direction (i.e., the A—A' direction), as shown in FIG. 13. The width of each of sensor elements 40B, 41B, 42B, and 43B along the line sensor movement direction (i.e., the direction substantially perpendicular to the sensor array direction) is larger than that of each of the sensor elements 40A, 41A, 42A, and 43A of red filter elements along the line sensor move direction (i.e., the direction substantially perpendicular to the sensor array direction). When the width of the sensor element of the green filter along the line sensor movement direction was larger than the width of the sensor element of the red filter element within the range of one time to 1.4 times, good results could be obtained. The best result could be obtained when the width of the former was larger than that of the latter within the range of 1.1 times to 1.3 times. Therefore, the sensitivity of the green filter element can be improved and its resolution is equal to that of the red element, thereby providing high image quality. It should be noted that the relationship between the sizes of the sensor elements of the blue and red filter elements is the same same as described above.

In the above embodiment, the standard illumination source 2 such as a halogen lamp is used as a light source. However, other color reading line sensor light sources such as an incandescent lamp, a xenon lamp, a fluorescent lamp, a mercury lamp, a sodium lamp, a metal halide lamp, and an EL lamp may be used in place of the halogen lamp. In this case, the size of the sensor element whose sensitivity is degraded by the light source used is set to be larger than those of other sensor elements by increasing the size along the relative movement direction between the light source and the line sensor, thereby achieving the object of the present invention.

The present invention is not limited to a sensor using a reduction or enlargement optical system, but can also be applied to a contact sensor.

The color reading line sensors according to the present invention have been described in detail. A relationship between the original, the imaging optical system, and the sensor will be described below.

Figure 14A:
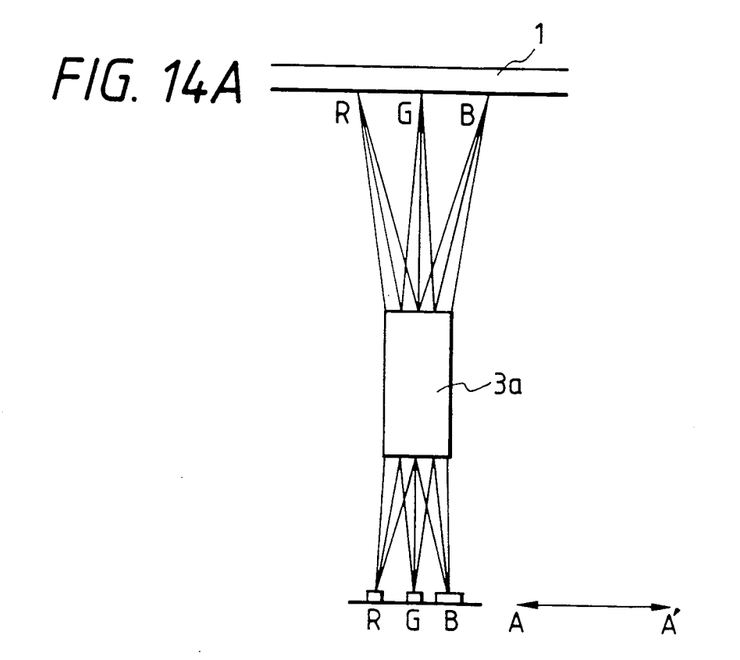
FIGS. 14A and 14B are views each showing the relationship between the sensor array of the color reading line sensor and the scanning line.
Figure 14B:
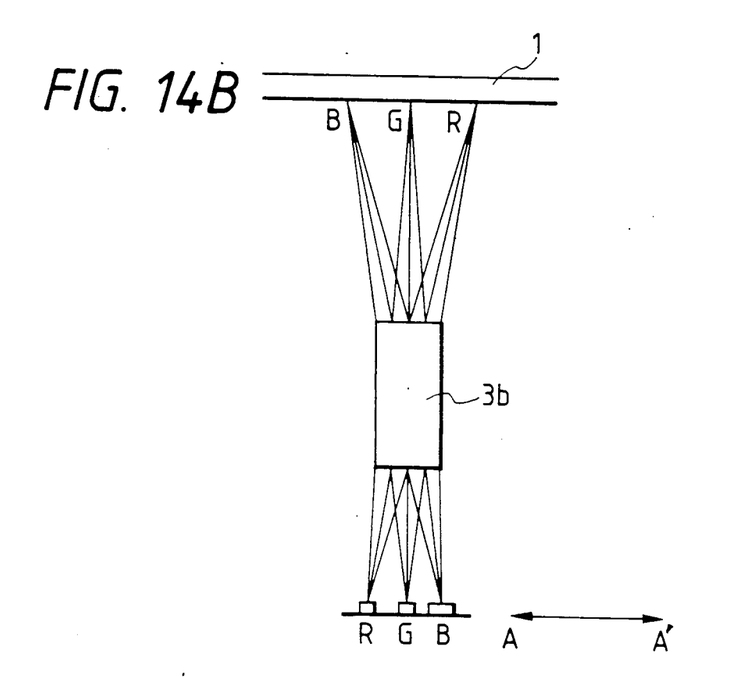

In order to read an image of an original by using a 3-line sensor shown in FIG. 5 according to the present invention, the image of the original 1 can be read along three main scanning lines parallel to three sensor arrays (directions perpendicular to the drawing surface of FIGS. 14A and 14B) of the red, green and blue filter elements, as shown in FIGS. 14A and 14B. The A—A' direction in FIGS. 14A and 14B is the relative move direction between the line sensor and the original, which is substantially perpendicular to the three sensor arrays of red, green and blue filter elements.

If the imaging optical system for focusing the image of the original 1 on the sensor is an imaging optical system 3a such as a SELFOC lens for forming an erected image, the relationship between the three sensor arrays and the three scanning lines is given, as shown in FIG. 14A. However, if the imaging optical system for forming the image of the original 1 on the sensor is an imaging optical system 3b for forming an inverted image, the relationship between the three sensor arrays and the three scanning lines is given, as shown in FIG. 14B.

As described above, by increasing the size of the sensor element whose sensitivity is degraded by the image reading light source in the conventional color reading line sensor along the relative movement direction between the light source and the line sensor, as compared with the sizes of other sensors, the following effects can be obtained:

1) The sensitivity of the sensitivity-degraded sensor element can be improved, and its resolution can be equal to those of other sensor elements, thereby providing high image quality; and 2) Degradation of the resolution by sensor movement can be prevented.

I claim:

1. A line sensor for reading a color original by executing relative movement between the line sensor and the original, comprising:

a plurality of sensor arrays each having a plurality of sensor elements and a corresponding plurality of color filter elements, said sensor arrays being aligned in a direction substantially perpendicular to a sensor array direction which is a direction substantially perpendicular to the direction of relative movement between the sensor arrays and the original, said sensor arrays extending in a direction substantially perpendicular to the direction of relative movement between the sensor arrays and the original, wherein a size of the sensor elements of a given one of said sensor arrays in the direction substantially perpendicular to the sensor array direction is larger than a size of the sensor elements of another one of said sensor arrays in the direction substantially perpendicular to the sensor array direction, and wherein a size of each sensor element of the given one sensor array in the sensor array direction is equal to a size of each sensor element of said another sensor array in the sensor array direction.

2. A sensor according to claim 1, wherein the sensor elements of said given sensor array include blue filter elements, and the sensor elements of said another sensor array include red or green filter elements.

3. A sensor according to claim 2, wherein a size of each sensor element of said given sensor array in the direction substantially perpendicular to the sensor array direction is larger than that of each sensor element of said another sensor array along the direction perpendicular to said sensor array direction within the range of 1.8 times to 2.2 times.

4. A sensor according to claim 2, wherein a size of each sensor element of said given sensor array in the direction substantially perpendicular to the sensor array direction is twice that of each sensor element of said another sensor array along the direction perpendicular to said sensor array direction.

5. A sensor according to claim 1, wherein the sensor elements of said given sensor array include green filter elements, and the sensor elements of said another sensor array include red filter elements.

6. A sensor according to claim 5, wherein a size of each sensor element of said given sensor array in the direction substantially perpendicular to the sensor array direction is larger than that of each sensor element of said another sensor array along the direction perpendicular to said sensor array direction within the range of greater than one time to equal to 1.4 times.

7. A sensor according to claim 1, wherein the sensor elements of said given sensor array include cyan filter elements, and the sensor elements of said another sensor array include red or green filter elements.

8. A sensor according to claim 7, wherein a size of each sensor element of said given sensor array in the direction substantially perpendicular to the sensor array direction is larger than that of each sensor element of said another sensor array along the direction perpendicular to said sensor array direction within the range of 1.8 times to 2.2 times.

9. A sensor according to claim 7, wherein a size of each sensor element of said given sensor array in the direction substantially perpendicular to the sensor array direction is twice that of each sensor element of said another sensor array along the direction perpendicular to said sensor array direction.

10. A line sensor for reading a color original by executing relative movement between the original and the line sensor, comprising:
a plurality of sensor arrays each having a plurality of sensors and a corresponding plurality of color filter elements, said plurality of sensor arrays extending in a direction substantially perpendicular to the direction of relative movement between said sensor arrays and the original,
wherein a size of the sensors with the color filter element having a given color in a direction substantially perpendicular to a sensor array direction is larger than a size of the sensors with the color filter element having another color along the direction substantially perpendicular to the sensor array direction, the sensor array direction being substantially perpendicular to the direction of relative movement between said sensor arrays and the original, and wherein a size of each sensor element of the sensor having the given color filter element in the sensor array direction is substantially equal to the size of each sensor element of the sensor having said another color in the sensor array direction.

11. A sensor according to claim 10, wherein the plurality of sensors having said color filter elements having the different colors are arranged such that the different colors are cyclically and continuously arranged.

12. A sensor according to claim 10, wherein said color filter element having the given color is a blue filter element, and the color filter element having said another color is a red or green filter element.

13. A sensor according to claim 12, wherein a size of said sensor element having said blue filter element along the direction substantially perpendicular to the sensor array direction is larger than that of said sensor element having said red or green filter element within the range of 1.8 times to 2.2 times.

14. A sensor according to claim 12, wherein a size of said sensor element having said blue filter element along the direction substantially perpendicular to the sensor array direction is twice than that of said sensor element having said red or green filter element.

15. A sensor according to claim 10, wherein said color filter element having the given color is a green filter element, and the color filter element having said another color is a red filter element.

16. A sensor according to claim 15, wherein a size of said sensor element having said green filter element along the direction substantially perpendicular to the sensor array direction is larger than that of said sensor element having said red filter element within the range of greater than one time to equal to 1.4 times.

17. A line sensor for reading a color original by executing relative movement between the original and the line sensor, comprising:
a first sensor array having a plurality of sensor elements and a plurality of color filter elements having different colors; and
a second sensor array having a plurality of sensor elements and a plurality of color filter elements having the same color, said first and second sensor arrays being aligned in a direction substantially perpendicular to a sensor array direction, the sensor array direction being substantially perpendicular to the direction of relative movement between the original and the first and second sensor arrays, said first and second sensor arrays both extending in a direction substantially perpendicular to the relative movement direction,
wherein a size of each sensor of said first sensor array in the direction perpendicular to the sensor array direction is smaller than that of a sensor of said second sensor array along the direction substantially perpendicular to the sensor array direction, and wherein a size of each sensor of said first sensor array in the sensor array direction is equal to a size of each sensor of said second sensor array in the sensor array direction.

18. A color image reading apparatus for reading a color object by executing relative movement between an image sensor and the object, comprising:
illuminating means for illuminating an object in a main scanning direction;

an imaging optical system for forming an image of the object in the main scanning direction; and an image sensor for reading the image of the object in the main scanning direction, said image sensor being provided with a plurality of sensor arrays each having a plurality of sensor elements and a plurality of color filter elements disposed in the main scanning direction, said sensor arrays being arranged in a direction substantially perpendicular to the main scanning direction, a size of each sensor of a given one of said sensor arrays in the direction substantially perpendicular to the main scanning direction being larger than that of each sensor of another sensor array along the direction perpendicular to the main scanning direction, the plurality of sensor arrays extending in a main scanning direction which is a direction substantially perpendicular to the direction of relative movement between the sensor arrays and the object, and wherein a size of each sensor of the given one of the sensor arrays in the main scanning direction is substantially equal to a size of each sensor of said another sensor array in the main scanning direction.

19. A color image reading apparatus for reading a color object by executing relative movement between an image sensor and the object, comprising:

illuminating means for illuminating an object on a plurality of major scanning lines;

an imaging optical system for forming images of the object on the major scanning lines; and a plurality of image sensors for respectively sensing light in direction wavelength ranges of the images of the object on the major scanning lines, said sensors extending in the direction of the major scanning lines at different positions with respect to a minor scanning direction substantially orthogonal to the major scanning direction, a size of a given sensor of said sensors along the minor scanning direction being larger than that of another sensor of said sensors along the minor direction, the main scanning direction being substantially perpendicular to the direction of relative movement between the object and the image sensor, and wherein a size of the given sensor of the sensors in the main scanning direction is equal to a size of the another sensor of the sensors in the main scanning direction.

20. A line sensor for reading a color original by executing relative movement between the line sensor and the original, comprising:

a plurality of sensor arrays each having a plurality of sensor elements and a corresponding plurality of color filter elements, said sensor arrays being aligned in a direction substantially perpendicular to a sensor array direction, wherein a size of the sensor elements of a given sensor array including cyan filter elements is larger in the direction substantially perpendicular to the sensor array direction when a size of the sensor elements of another sensor array including either red or green filter elements in the direction substantially perpendicular to the sensor array direction.

21. A sensor according to claim 20, wherein a size of each sensor element of said given sensor array in the direction substantially perpendicular to the sensor array direction is larger than that of each sensor element of said another sensor array along the direction perpendicular to said sensor array direction within the range of 1.8 times to 2.2 times.

22. A sensor according to claim 20, wherein a size of each sensor element of said given sensor array in the direction substantially perpendicular to the sensor array direction is twice that of each sensor element of said another sensor array along the direction perpendicular to said sensor array direction.

23. A line sensor for reading a color original by executive relative movement between the original and the line sensor, comprising:

a first sensor array having a plurality of sensor elements and a plurality of blue filter elements;

a second sensor array having a plurality of sensor elements and a plurality of red filter elements; and a third sensor array having a plurality of sensor elements and a plurality of green filter elements, the first, second, and third sensor arrays each extending in a direction substantially perpendicular to the direction of the relative movement between the original and the line sensor;

wherein each sensor array includes only a single line of sensor elements, and wherein a size of each sensor element of said first sensor array is larger in a direction perpendicular to a sensor array direction than a size of each sensor element of either the second or third sensor arrays in the direction perpendicular to the sensor array direction, and wherein a size of each sensor element of the first sensor array in the sensor array direction is substantially equal to a size of each sensor element of either the second or third sensor arrays in the sensor array direction.

24. A sensor according to claim 23, wherein a size of each sensor element of said first sensor array is larger in the direction perpendicular to the sensor array direction than each sensor element of either said sensor or third sensor arrays in the direction perpendicular to the sensor array direction within the range of 1.8 times to 2.2 times.

25. A sensor according to claim 23, wherein a size of each sensor element of said first sensor array in the direction perpendicular to the sensor array direction is twice that of each sensor element of either said second or third sensor arrays in the direction perpendicular to the sensor array direction.

* * * * *

UNITED STATES PATENT AND TRADEMARK OFFICE
CERTIFICATE OF CORRECTION

PATENT NO. : 5,055,921
DATED : October 8, 1991
INVENTOR(S) : YOSHIKO USUI

It is certified that error appears in the above-identified patent and that said Letters Patent is hereby corrected as shown below:

ON THE TITLE PAGE

IN [56] REFERENCES CITED

U.S. PATENT DOCUMENTS, "Wagersonner et al." should read --Wagensonner et al.--.

COLUMN 1

Line 28, "elements A" should read --elements. A--.
Line 53, "pels" should read --cells--.

COLUMN 2

Line 60, "source A" should read --source--.

COLUMN 4

Line 11, "Referring" should read --¶ Referring--.
Line 30, "move" should read --movement--.
Line 31, "move" should read --movement--.
Line 33, "move" should read --movement--.

COLUMN 5

Line 16, "blue filter elements 20C, 21C and 22C" should read --blue filter elements 40C, 41C and 42C--.
Line 17, "sensor elements 20C, 21C," should read --sensor elements 40C, 41C,--.
Line 18, "22C" should read --42C--.
Line 46, "move" should read --movement--.

UNITED STATES PATENT AND TRADEMARK OFFICE
CERTIFICATE OF CORRECTION

PATENT NO. : 5,055,921

DATED : October 8, 1991

INVENTOR(S) : YOSHIKO USUI

It is certified that error appears in the above-identified patent and that said Letters Patent is hereby corrected as shown below:

COLUMN 6

Line 33, "obtained  The" should read --obtained.  The--.

COLUMN 7

Line 51, "move" should read --movement--.

COLUMN 8

Line 24, "move" should read --movement--.
Line 33, "FIG. 14a." should read --FIG. 14A.--.

COLUMN 10

Line 12, "arranged." should read --arrayed.--.
Line 26, "than" should be deleted.

COLUMN 11

Line 32, "direction" should read --different--.

UNITED STATES PATENT AND TRADEMARK OFFICE
CERTIFICATE OF CORRECTION

PATENT NO. : 5,055,921
DATED : October 8, 1991
INVENTOR(S) : YOSHIKO USUI

It is certified that error appears in the above-identified patent and that said Letters Patent is hereby corrected as shown below:

COLUMN 12

Line 47, "said sensor" should read --said second--.

Signed and Sealed this

Eighth Day of June, 1993

Attest:

MICHAEL K. KIRK

Attesting Officer        Acting Commissioner of Patents and Trademarks